(12) United States Patent
Mann et al.

(10) Patent No.: US 10,439,064 B1
(45) Date of Patent: Oct. 8, 2019

(54) DUAL PORT VERTICAL TRANSISTOR MEMORY CELL

(71) Applicant: GLOBALFOUNDRIES Inc., Grand Cayman OT (KY)

(72) Inventors: Randy W. Mann, Milton, NY (US); Bipul C. Paul, Mechanicville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/990,956

(22) Filed: May 29, 2018

(51) Int. Cl.
*H01L 23/528* (2006.01)
*H01L 29/78* (2006.01)
*H01L 29/66* (2006.01)
*H01L 27/11* (2006.01)
*H01L 27/092* (2006.01)

(52) U.S. Cl.
CPC ........ *H01L 29/7827* (2013.01); *H01L 23/528* (2013.01); *H01L 27/1104* (2013.01); *H01L 29/66666* (2013.01); *H01L 27/092* (2013.01)

(58) Field of Classification Search
CPC ........... H01L 29/7827; H01L 29/66666; H01L 27/1104; H01L 27/092; H01L 27/281; H01L 27/0207; H01L 27/0924; H01L 27/11–1116; H01L 23/528; H01L 29/42392; H01L 29/78642; G11C 11/412
See application file for complete search history.

(56) References Cited

U.S. PATENT DOCUMENTS

| | | | |
|---|---|---|---|
| 8,154,086 B2 | 4/2012 | Masuoka et al. | |
| 8,754,481 B2 | 6/2014 | Masuoka et al. | |
| 9,515,077 B1 * | 12/2016 | Liaw | H01L 27/1104 |
| 9,721,957 B2 | 8/2017 | Nakanishi et al. | |
| 2004/0113207 A1 | 6/2004 | Hsu et al. | |
| 2005/0124095 A1 * | 6/2005 | Liaw | H01L 23/50 |
| | | | 438/128 |
| 2007/0075359 A1 | 4/2007 | Yoon et al. | |
| 2008/0179693 A1 | 7/2008 | Kim et al. | |
| 2010/0203714 A1 | 8/2010 | Masuoka et al. | |
| 2011/0018056 A1 * | 1/2011 | Takeuchi | H01L 21/76895 |
| | | | 257/329 |

(Continued)

OTHER PUBLICATIONS

Chung et al., "Novel 4F2 DRAM Cell with Vertical Pillar Transistor (VPT)," 2011 IEEE, pp. 211-214.

*Primary Examiner* — Eric A. Ward
*Assistant Examiner* — Eric K Ashbahian
(74) *Attorney, Agent, or Firm* — Amerson Law Firm, PLLC

(57) ABSTRACT

A first S/D region includes a first P-type region, a first N-type region, and a first conductive layer thereon to define a first cell node. A second S/D region includes a second P-type region, a second N-type region, and a second conductive layer thereon to define a second cell node. A PDL transistor and PGLA, PGLB transistors have bottom SD regions in the first N-type region. A PUL transistor has a bottom SD region positioned in the first P-type region. A PDR transistor and PGRA, PGRB have bottom SD regions in the second N-type region. A PUR transistor has a bottom SD region in the second P-type region. A first gate is positioned around channel regions of the PUL and PDL transistors and conductively coupled to the second node. A second gate is positioned around channel regions of the PUR and PDR transistors and conductively coupled to the first node.

18 Claims, 8 Drawing Sheets

(56) References Cited

U.S. PATENT DOCUMENTS

| | | | |
|---|---|---|---|
| 2011/0140203 A1* | 6/2011 | Hou | H01L 21/823871 257/401 |
| 2014/0003133 A1 | 1/2014 | Lin et al. | |
| 2014/0185365 A1* | 7/2014 | Liaw | G11C 8/16 365/154 |
| 2015/0179655 A1* | 6/2015 | Nakanishi | H01L 51/0575 257/9 |
| 2015/0318288 A1 | 11/2015 | Lim et al. | |
| 2016/0133633 A1 | 5/2016 | Liaw | |
| 2016/0284712 A1 | 9/2016 | Liaw | |

\* cited by examiner

DUAL PORT VERTICAL TRANSISTOR MEMORY CELL

BACKGROUND OF THE INVENTION

1. Field of the Invention

The present disclosure generally relates to the fabrication of semiconductor devices, and, more particularly, to various embodiments of a dual port vertical transistor memory cell.

2. Description of the Related Art

In general, memory devices are the means by which electronic information is stored. There are many types of memory devices, e.g., SRAMs (Static Random Access Memory), DRAMs (Dynamic Random Access Memory), ROMs (Read Only Memory), etc., each of which has its own advantages and disadvantages relative to other types of memory devices. For example, SRAMs are typically employed in applications where higher speed and/or reduced power consumption is important, e.g., cache memory of a microprocessor, mobile phones and other mobile consumer products, etc. Millions of such memory devices are typically included in even very basic electronic consumer products. Irrespective of the type of memory device, there is a constant drive in the industry to increase the performance and durability of such memory devices. In typical operations, an electrical charge (HIGH) is stored in the memory device to represent a digital "1", while the absence of such an electrical charge or a relatively low charge (LOW) stored in the device indicates a digital "0". Read/write circuitry is used to access the memory device to store digital information on such a memory device and to determine whether or not a charge is presently stored in the memory device. These read/write cycles typically occur millions of times for a single memory device over its effective lifetime.

FIG. 1 depicts a typical prior art schematic configuration of a dual port SRAM memory cell 10 that includes two CMOS-based inverters—INVL and INVR—and two read ports—RPA, RPB. In general, the SRAM cell 10 includes four NMOS pass gate transistors PGLa, PGLb, PGRa, PGRb, two PMOS pull-up transistors PUL, PUR, and two NMOS pull-down transistors PDL, PDR. Each of the PMOS pull-up transistors PUL, PUR has its gate (14A, 14B, respectively) connected to the gate (16A, 16B, respectively) of a corresponding NMOS pull-down transistor PDL, PDR. The PMOS pull-up transistors PUL, PUR have their drain regions (D) connected to the drain regions of corresponding NMOS pull-down transistors PDL, PDR to form the inverters INVL and INVR, each of which has a conventional configuration. The source regions (S) of the PMOS pull-up transistors PUL, PUR are connected to a high reference potential, typically Vdd. The source regions (S) of the NMOS pull-down transistors PDL, PDR are connected to a lower reference potential, typically Vss or ground. The PMOS pull-up transistor PUL and the NMOS pull-down transistor PDL make up the first inverter INVL of the SRAM cell 10. The PMOS pull-up transistor PUR and the NMOS pull-down transistor PDR make up the second inverter INVR of the SRAM cell 10. The main function of an inverter is to invert the input signal applied to its input, i.e., an inverter circuit outputs a voltage representing the opposite logic level to the voltage applied to its input. If the applied input voltage is logically low, then the output voltage becomes high and vice versa.

The gate 14A of the PMOS pull-up transistor PUL and the gate 16A of the NMOS pull-down transistor PDL are cross-coupled (i.e., connected) to the drain regions (D) of the transistors PUR, PDR of the other inverter at node NR. Similarly, the gate 14B of the PMOS pull-up transistor PUR and the gate 16B of the NMOS pull-down transistor PDR are cross-coupled (i.e., connected) to the drain regions (D) of the transistors PUL, PDL at node NL. Hence, the potential present on the drain regions of the transistors PUL, PDL (node NL) of the first inverter is applied to the gates of transistors PUR, PDR of the second inverter and the charge serves to keep the second inverter in an ON or OFF state. The logically opposite potential is present on the drain regions of the transistors PUR, PDR (node NR) of the second inverter and on the gates of the transistors PUL, PDL of the first inverter, keeping the first inverter in the complementary OFF or ON state relative to the second inverter. Thus, the latch of the illustrated SRAM cell 10 has two stable states: a first state with a predefined potential present on charge storage node NL and a low potential on charge storage node NR; and a second state with a low potential on charge storage node NL and the predefined potential on charge storage node NR. Binary data are recorded by toggling between the two states of the latch. Sufficient charge must be stored on the charge storage node, and thus on the coupled gates of the associated inverter, to unambiguously hold one of the inverters "ON" and unambiguously hold the other of the inverters "OFF", thereby preserving the memory state. The SRAM cell 10 may be read concurrently using two independent ports (a and b). First and second word lines, WLa, WLb control the respective pass gates, PGLa, PGRa and PGLb, PGRb. The stability of an SRAM cell 10 can be quantified by the margin by which the potential on the charge storage nodes can vary from its nominal value while still keeping the SRAM 10 cell in its original state. In manufacturing such an SRAM cell 10, a conductive contact structure must be formed to cross-couple (or conductively couple) a shared drain region on the first inverter with a gate structure of the second inverter.

The present disclosure is directed to various embodiments of a dual port vertical transistor memory cell and various methods of making such a dual port vertical transistor memory cell.

SUMMARY OF THE INVENTION

The following presents a simplified summary of illustrative embodiments of the invention in order to provide a basic understanding of some aspects of the illustrative embodiments of the invention. This summary is not an exhaustive overview of the illustrative embodiments of the invention specifically discussed herein. It is not intended to identify key or critical elements of the invention or to delineate the scope of the invention. Its sole purpose is to present some concepts in a simplified form as a prelude to the more detailed description that is discussed later.

Generally, the present disclosure is directed to various embodiments of a dual port vertical transistor memory cell and various methods of making such a dual port vertical transistor memory cell. One illustrative IC product disclosed herein includes a first merged doped source/drain region including a first P-type region, a first N-type region, and a first conductive layer positioned on the first P-type region and the first N-type region to define a first node of a memory cell. A second merged doped source/drain region includes a second P-type region, a second N-type region, and a second conductive layer positioned on the second P-type region and the second N-type region to define a second node of the memory cell. A first pull-down transistor and first and second pass gate transistors have bottom source/drain regions positioned in the first N-type region. A first pull-up transistor has a bottom source/drain region positioned in the first P-type region. A second pull-down transistor and third and fourth pass gate transistors have bottom source/drain regions positioned in the second N-type region. A second pull-up transistor has a bottom source/drain region positioned in the second P-type region. A first conductive gate structure is positioned around channel regions of the first pull-up transistor and the first pull-down transistor and conductively coupled to the second node. A second conductive gate structure is positioned around channel regions of the second pull-up transistor and the second pull-down transistor and conductively coupled to the first node.

Another illustrative IC product disclosed herein includes a first merged doped source/drain region including a first P-type region, a first N-type region, and a first conductive layer positioned on the first P-type region and the first N-type region to define a first node of a memory cell. A second merged doped source/drain region includes a second P-type region, a second N-type region, and a second conductive layer positioned on the second P-type region and the second N-type region to define a second node of the memory cell. First and second pull-down transistors and first and second pass gate transistors have bottom source/drain regions positioned in the first N-type region. A first pull-up transistor has a bottom source/drain region positioned in the first P-type region. Third and fourth pull-down transistors and third and fourth pass gate transistors have bottom source/drain regions positioned in the second N-type region. A second pull-up transistor has a bottom source/drain region positioned in the second P-type region. A first L-shaped gate structure is positioned around channel regions of the first pull-up transistor and the first and second pull-down transistors and conductively coupled to the second node. A second L-shaped gate structure is positioned around channel regions of the second pull-up transistor and the third and fourth pull-down transistors and conductively coupled to the first node.

BRIEF DESCRIPTION OF THE DRAWINGS

The disclosure may be understood by reference to the following description taken in conjunction with the accompanying drawings, in which like reference numerals identify like elements, and in which.

Figure 1:
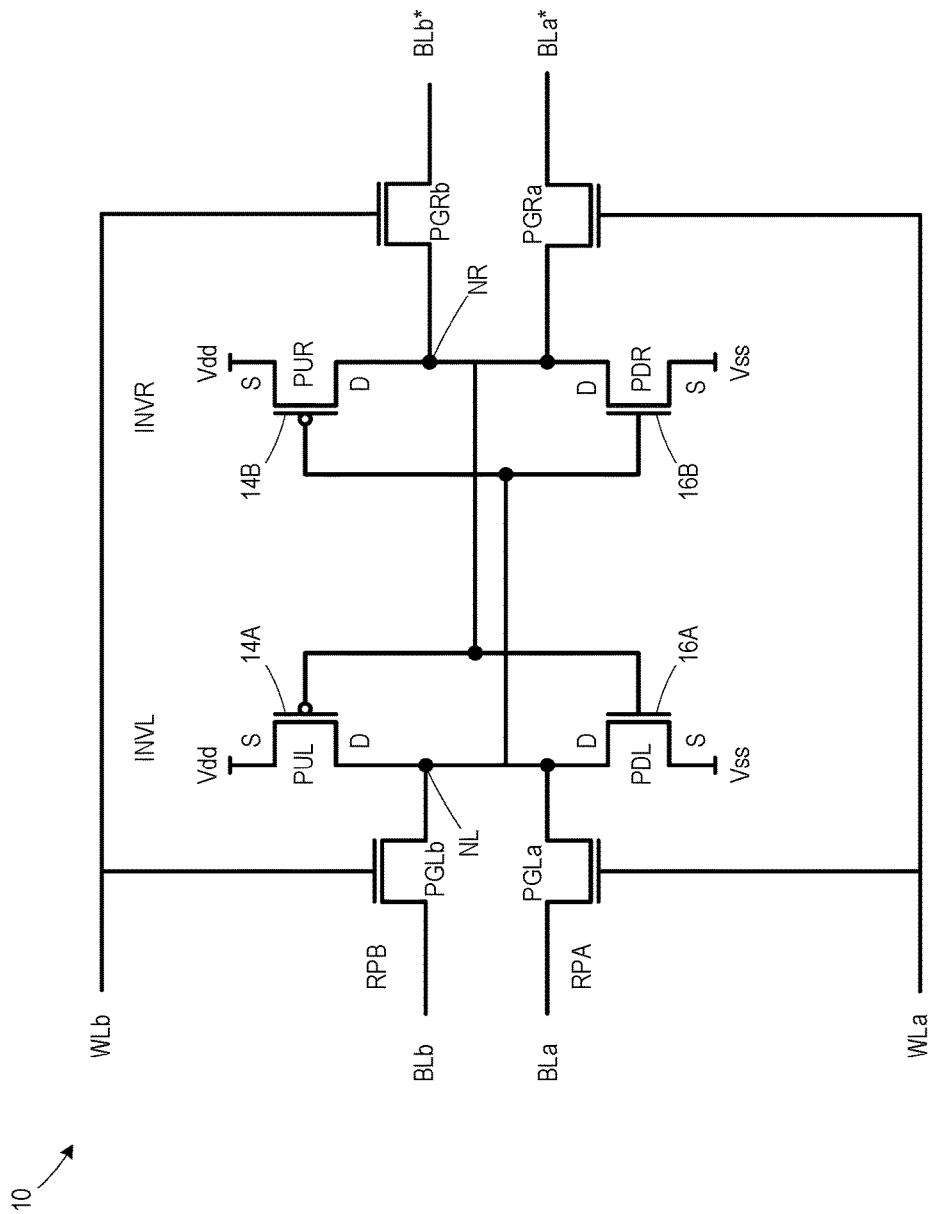
FIG. 1 is an electrical schematic of an illustrative prior art SRAM cell that includes two CMOS-based inverters.

While the subject matter disclosed herein is susceptible to various modifications and alternative forms, specific embodiments thereof have been shown by way of example in the drawings and are herein described in detail. It should be understood, however, that the description herein of specific and illustrative embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. The various layers of material described below may be formed by any of a variety of different known techniques, e.g., a chemical vapor deposition (CVD) process, an atomic layer deposition (ALD) process, a thermal growth process, epitaxial growth processes, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 2-7 are various views that depict the various embodiments of a dual port vertical transistor memory cell for an IC product 200. The presently disclosed illustrative embodiments of the inventions will be discussed in the context where the dual port vertical transistor memory cell includes illustrative vertical transistor devices 202 formed above a substrate 204.

Figure 2:
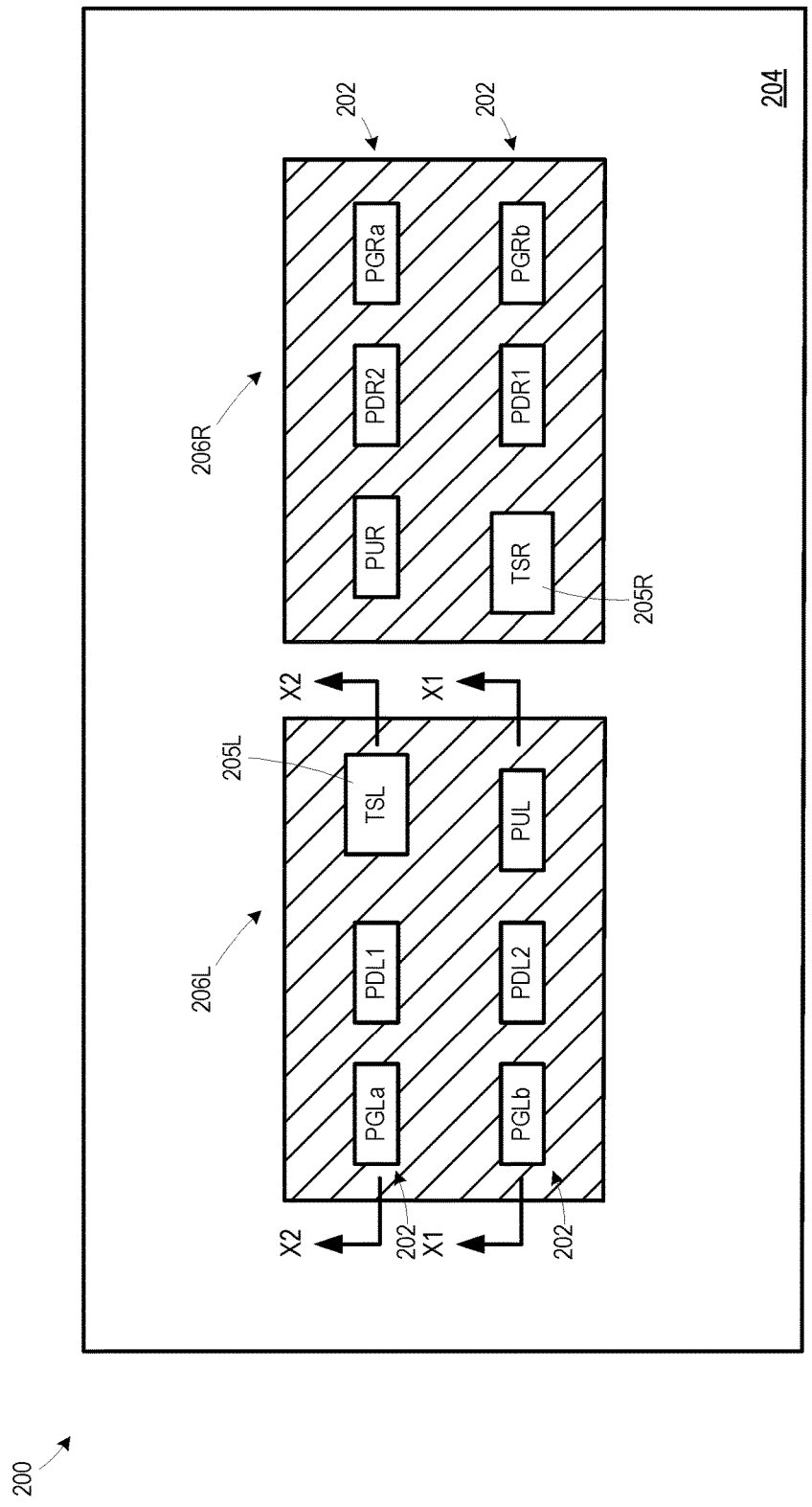
FIGS. 2-7 are various views that depict various embodiments of a dual port vertical transistor memory cell for IC products.

FIG. 2 is a simplistic plan view of an embodiment of the IC product 200 that includes an illustrative dual port SRAM cell. The dual port SRAM cell includes illustrative and schematically depicted vertical transistor devices 202, including NMOS pass gate transistors PGLa and PGRa for a first read port, NMOS pass gate transistors PGLb and PGRb for a second read port, two PMOS pull-up transistors PUL, PUR, and two NMOS pull-down transistors PDL1, PDL2 and PDR1, PDR2. PDL1 and PDL2 are connected in parallel making one effective transistor, represented as PDL in FIG. 1. Likewise, PDR1 and PDR2 are connected in parallel making one effective transistor, represented as PDR in FIG. 1. Each of the vertical transistors includes a simplistically depicted vertically oriented channel semiconductor (VOCS) structure. The VOCSs of the vertical transistor devices 202 may be, as shown in the illustrated embodiment, but vertical structures with different horizontal cross-sections may be used, such as elliptical or rectangular pillars. The relative strengths of the vertical transistor devices 202 may be varied by adjusting the cross-sectional area, or by connecting multiple devices in parallel (e.g., such as with PDL1/PDL2 or PDR1/PDR2). However, as will be appreciated by those skilled in the art, the drawings provided herein depict the formation of the IC product 200 at a given point in the process flow disclosed herein. It should be understood that these drawings are not intended to, nor do they, show the full, final formation of functional vertical transistor devices 202. FIG. 2 also illustrates source/drain contacts 205L, 205R (i.e., trench silicide contacts 205L, 205R (TSL, TSR).

Figure 3:
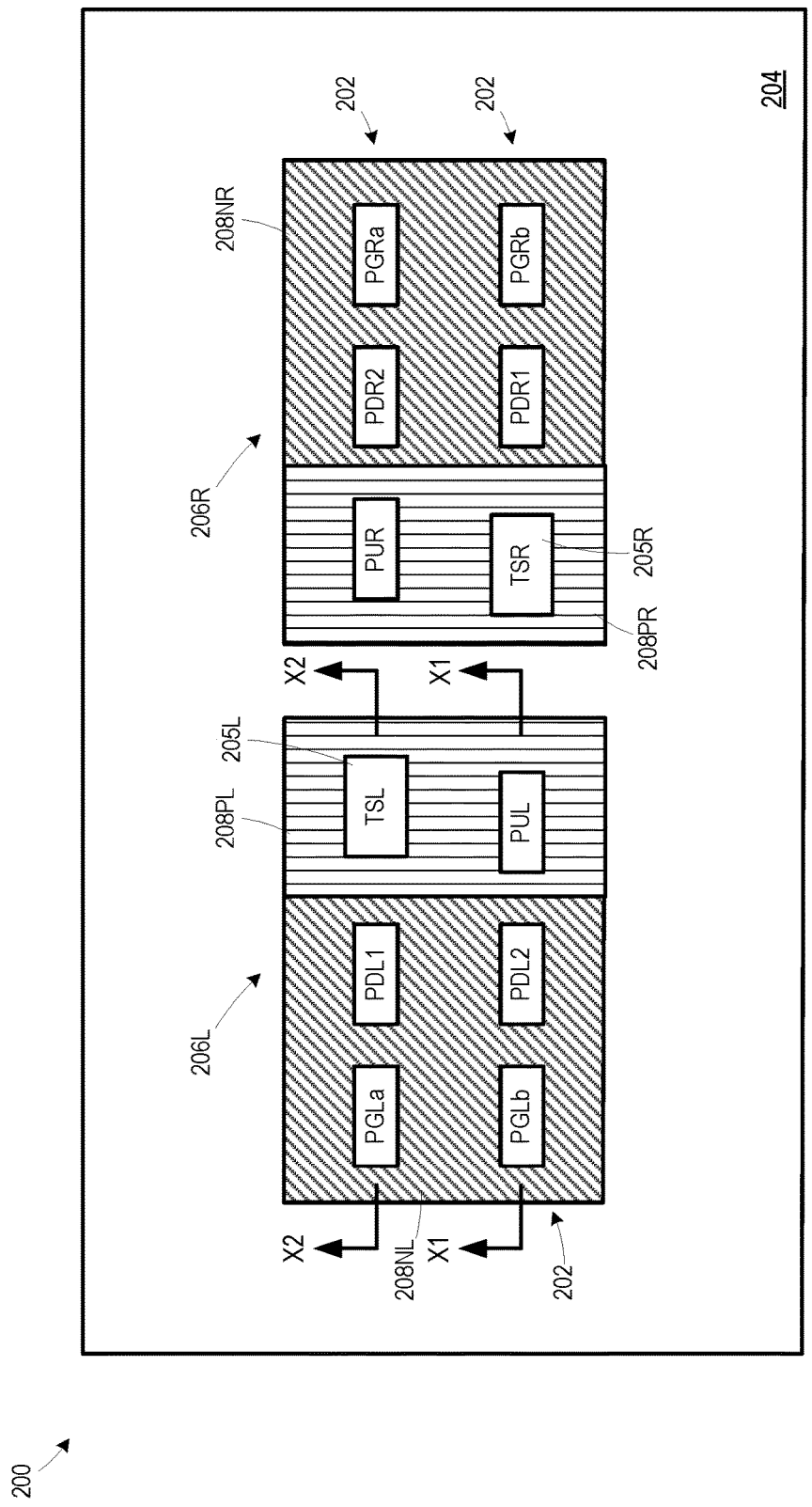

With reference to FIGS. 2 and 3, and as disclosed more fully below, in the depicted example, the transistors 202 are formed above two substantially rectangular-shaped (when viewed from above) merged doped source/drain regions—a first merged doped source/drain region 206L and a second merged doped source/drain region 206R. Each of the merged doped source/drain regions 206L, 206R is contiguous. As shown in FIG. 3, after fabrication is completed, each of the merged doped source/drain regions 206L, 206R includes two oppositely doped regions that engage one another along an interface. More specifically, in the example depicted herein, the first merged doped source/drain region 206L includes a first N-doped region 208NL and a first P-doped region 208PL, while the second merged doped source/drain region 206R includes a second N-doped region 208NR and a second P-doped region 208PR. As described more fully below, these N- and P-type doped regions may be formed in a semiconductor material, i.e., either in an epitaxial semiconductor material formed above the semiconductor substrate 204 or in the semiconductor substrate 204 itself. These N- and P-type doped regions are "merged" since there is no isolation material positioned between the doped regions within a single merged doped source/drain region 206L 206R, e.g., the first P-doped region 208PL directly engages the first N-doped region 208NL along an interface within the first merged doped source/drain region 206L. After forming the oppositely doped portions 208NL/208PL and 208NR/208PR, a silicidation process is performed to define a conductive layer 210L, 210R (see FIG. 4) on each of the merged doped source/drain regions 206L, 206R. The conductive layer 210L serves as the node NL in FIG. 1, and the conductive layer 210R serves as the node NR.

Several of the drawings herein are cross-sectional drawings depicting the view taken at the location indicated by arrows X1-X1 (i.e., a cross-sectional view taken through the PGLb, PDL2, and PUL in the merged source/drain region 206L) and at the location indicated by arrows X2-X2 (i.e., a cross-sectional view taken through the PGLa, PDL1, and TSL). The second merged doped source/drain region 206R is symmetrical to the first merged doped source/drain region 206L (i.e., mirrored and flipped), so it is not illustrated separately in the cross-sectional views.

Figure 4:
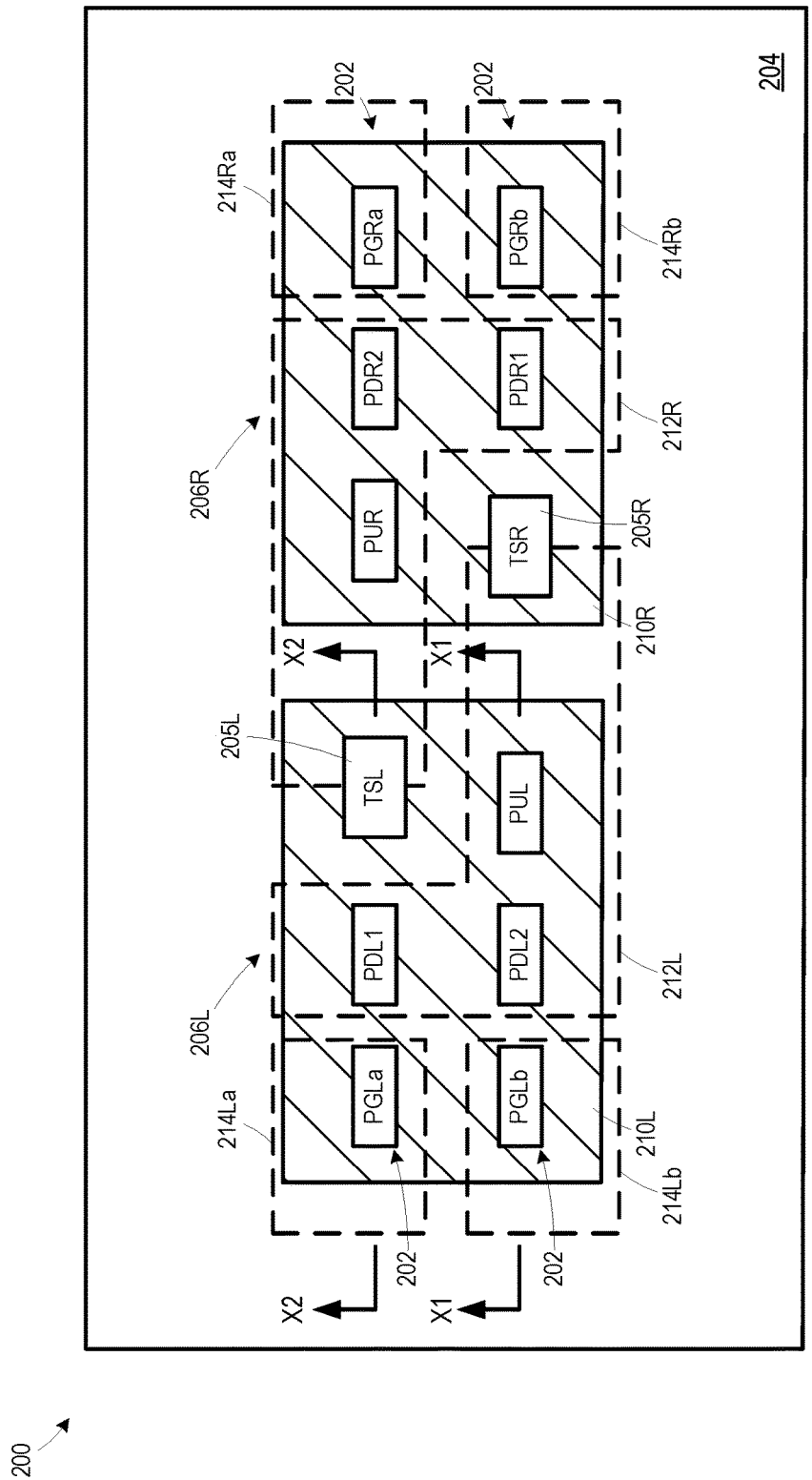

FIG. 4 depicts (in dashed lines) various separate and discrete conductive gate structures 212L, 212R, 214La, 214Lb, 214Ra, 214Rb, collectively referred to as gate structures 212, 214. The conductive gate structures 212, 214 positioned around channel regions of the transistor devices 202 may be formed using either gate-first or replacement gate manufacturing techniques. In general, the conductive gate structures 212, 214 may each include a gate insulation layer, a conductive gate electrode, a work function material, one or more barrier layers, etc. (not separately shown). Note that the gate structure 212L has an L-shaped horizontal cross-section and is shared by the PDL1/PDL2 transistor and the PUL transistor, while the gate structure 212R also has an L-shaped horizontal cross-section and is shared by the PDR1/PDR2 transistor and the PUR transistor. Each of the pass gate transistors PGLa, PGLb, PGRa, PGRb has its own discrete gate structure 214La, 214Lb, 214Ra, 214Rb, respectively. The trench silicide contact 205L (TSL) conductively couples the gate structure 212R to the first merged doped source/drain region 206L (i.e., N1), and the trench silicide contact 205R (TSR) conductively couples the gate structure 212L to the second merged doped source/drain region 206R (i.e., N2).

Figure 5:
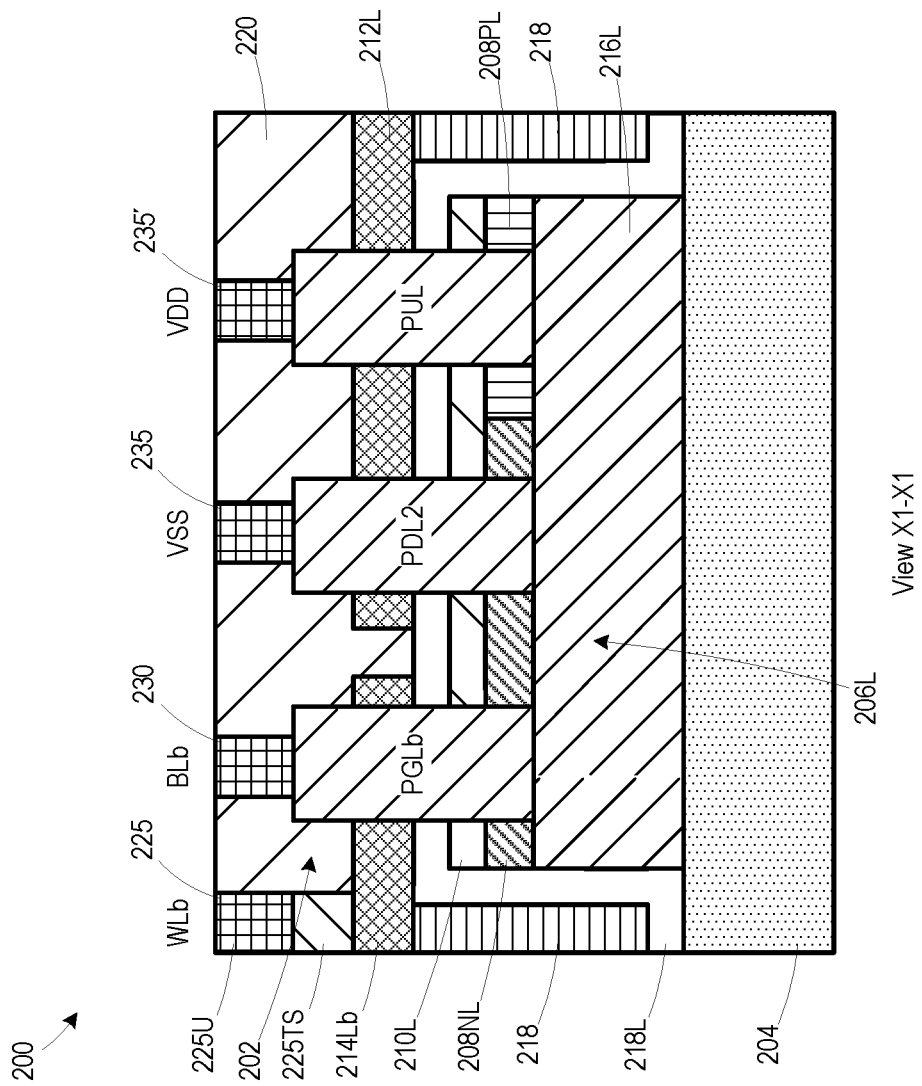
Figure 6:
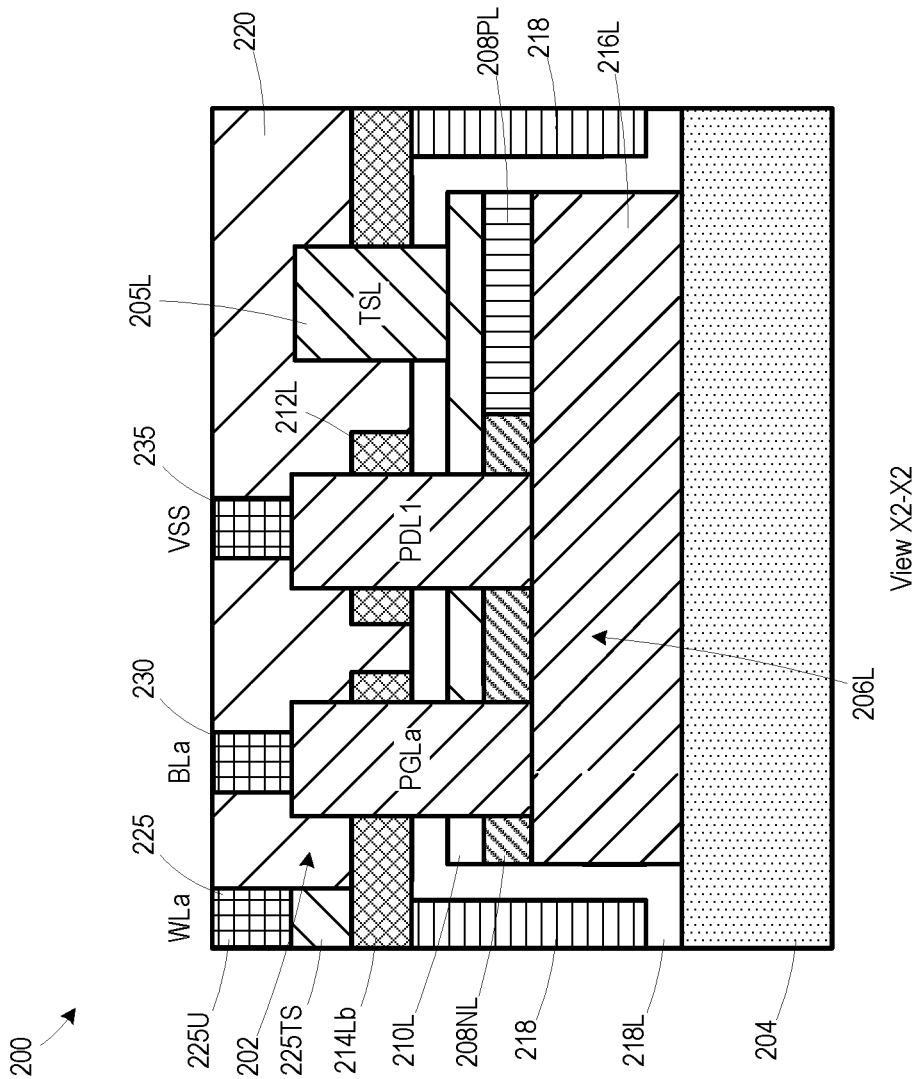

FIGS. 5 and 6 depict cross-sectional views of the first merged doped source/drain region 206L along lines X1-X1 and X2-X2, respectively. As described above, the structure for the second merged doped source/drain region 206R is symmetrical, so it is not separately illustrated. The IC product 200 is formed in and above a semiconductor substrate 204. The substrate 204 may have a variety of configurations, such as the bulk substrate configuration depicted herein or a semiconductor-on-insulator (SOI) configuration. Such an SOI substrate includes a bulk semiconductor layer, a buried insulation layer positioned on the bulk semiconductor layer and an active semiconductor layer positioned on the buried insulation layer, wherein the transistor devices 202 are formed in and above the active layer. The active layer and/or the bulk semiconductor layer may be made of silicon or they may be made of semiconductor materials other than silicon, and they both do not have to be made of the same semiconductor material. Thus, the terms "substrate" or "semiconductor substrate" should be understood to cover all semiconducting materials and all forms of such materials.

The first merged doped source/drain region 206L includes a well region 216L (e.g., N-doped) positioned in the substrate 204 (e.g., P-doped) and bounded by shallow trench isolation (STI) structures 218. The first N-doped region 208NL and the first P-doped region 208PL are positioned in the well region 216L and the conductive layer 210L is positioned on the top surface thereof to define the node NL. The first N-doped region 208NL defines the lower source/drain regions of the N-type transistors PGLa, PGLb, PDL1 and PDL2. The first P-doped region 208PL defines the lower source/drain regions of the P-type transistor PUL. A lower spacer 218L is positioned at least on an upper surface of the conductive layer 210L. The conductive gate structures 212, 214 are embedded in a dielectric layer 220 (e.g., silicon dioxide, low-k dielectric material, ultra-low-k dielectric material, etc.). In an embodiment where the substrate 204 has an SOI configuration, the N-doped region 208NL and the first P-doped region 208PL may be positioned above a buried oxide (BOX) layer and the well region 216L would not be present.

The various structures and regions depicted in FIGS. 5 and 6 may be formed by performing a variety of different known manufacturing techniques and using a variety of different materials. The STI structures 218 may include an insulating material, such as silicon dioxide. The STI structures 218 may also include one or more conformal liner layers (not separately shown) that were deposited in isolation trenches prior to overfilling the isolation trenches with insulation material to define the STI structures 218. A portion of the STI structures 218 is positioned laterally between the merged doped source/drain regions 206L and 206R. The dopant concentration and depth of the various doped regions shown herein may vary depending upon the particular application. At some point during the process flow, the product may be subjected to at least one anneal process. During that at least one anneal process, dopants from the doped source/drain regions 208NL, 208PL will migrate laterally into the VOCS structures, but such migrated dopants are not depicted so as not to overly complicate the drawings.

The conductive layer 210L (e.g., a metal silicide layer) was formed on and in physical contact with the upper surfaces of the doped source/drain regions (208NL, 208NR, 208PL, 208PR) using traditional manufacturing techniques and materials that are well known to those skilled in the art. The conductive layer 210L may be formed to any desired thickness, and it may include any desired conductive material, e.g., cobalt silicide, titanium silicide, etc. Various protective spacers that are positioned on sidewalls of the VOCS structures to prevent formation of the metal silicide material during this process are not depicted. Note that the conductive layer 210L does not form on the STI structures 218.

Contacts for completing the interconnections for the SRAM cell are also embedded in the dielectric layer 220, including word line contacts 225 (WLa and WLb), bit line contacts 230 (BLa and BLb), and supply contacts 235 (VSS and VDD). The word line contacts 225 may have a trench silicide portion 225TS formed concurrently with the source/drain contacts 205L, 205R and an upper portion 225U formed concurrently with the other contacts 230, 235.

Figure 7:
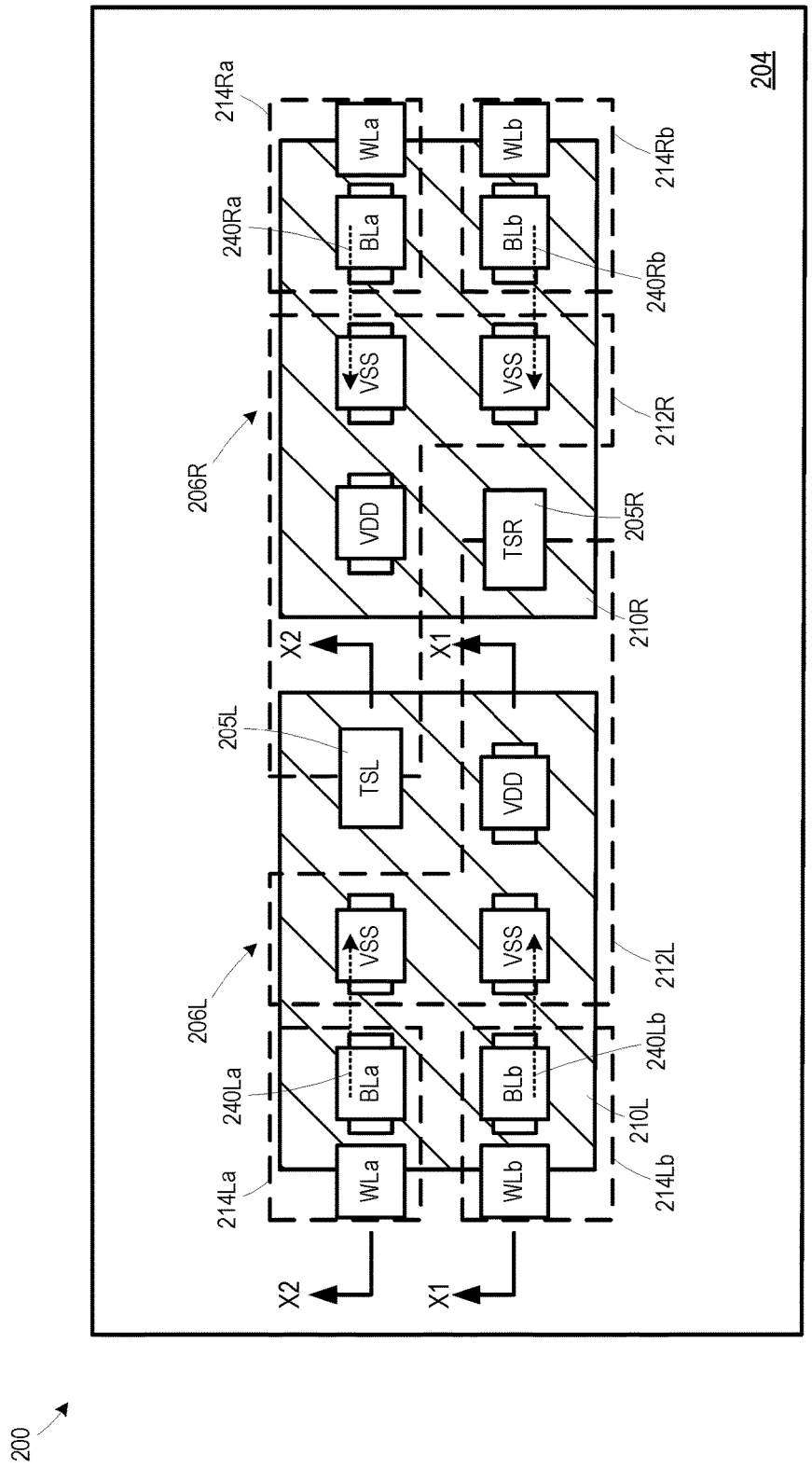

FIG. 7 illustrates a top view of the IC product 200 showing the arrangement of the contacts 225 (WLa, WLb), 230 (BLa, BLb), 235 (VSS, VDD). FIG. 7 also illustrates the read current paths 240La, 240Lb, 240Ra, 240Rb for the IC product 200.

Figure 8:
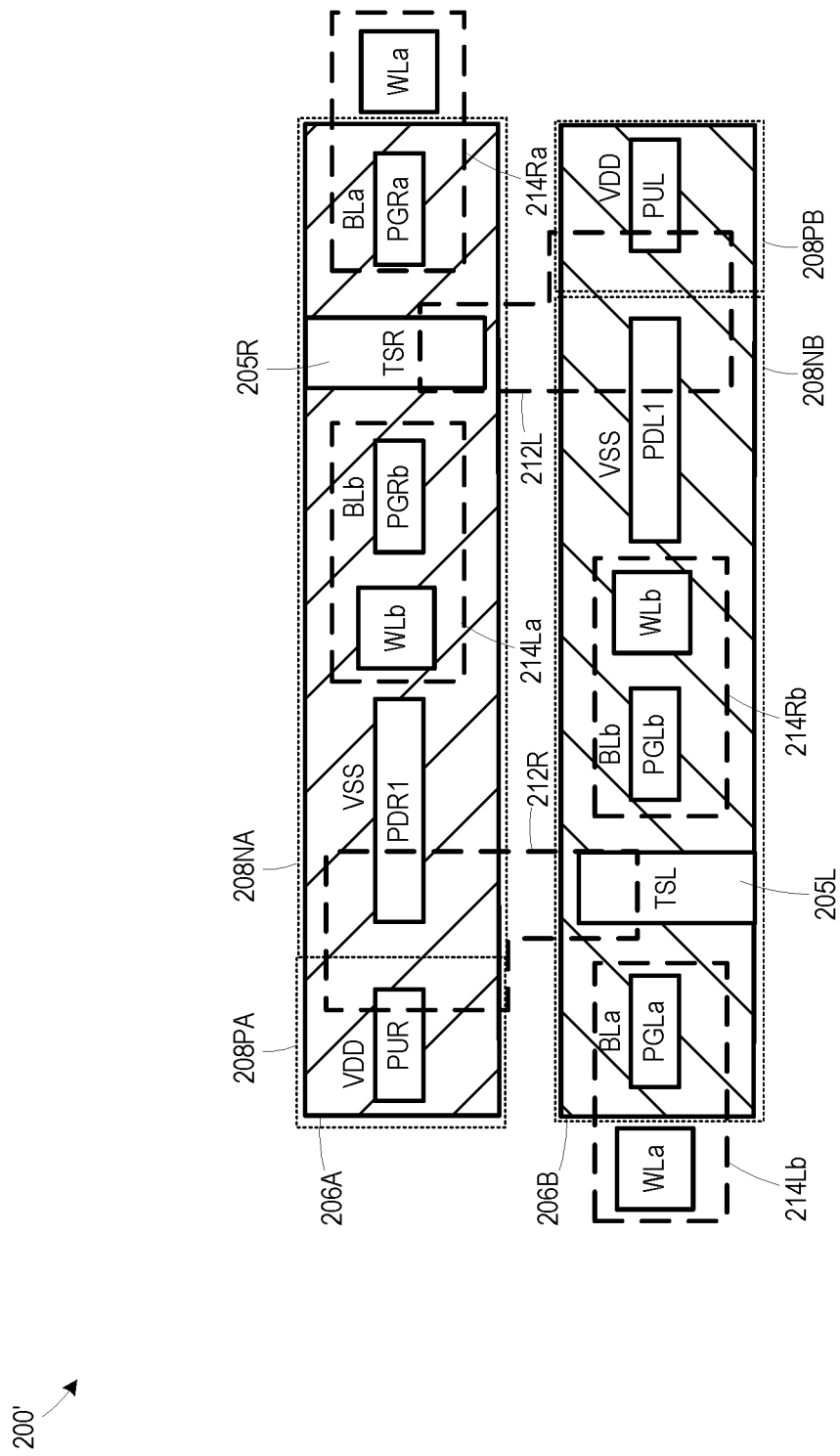
FIG. 8 is a top view depicting an alternative embodiment of a dual port vertical transistor memory cell for IC products.

FIG. 8 illustrates a top view of an alternative embodiment of the IC product 200' including a first merged doped source/drain region 206A and a second merged doped source/drain region 206B. The merged doped source/drain regions 206A, 206B include P-doped regions 208PA, 208PB and N-doped regions 208NA, 208NB. The conductive gate structures 212L, 212R, 214La, 214Lb, 214Ra, 214Rb and trench silicide contact 205L, 205R (TSL, TSR) form interconnections as described above. The conductive gate structures 212L, 212R each have an L-shaped horizontal cross-section.

At this point in the process flow, traditional manufacturing operations may be performed to complete the fabrication of the IC products 200, 200'. For example, one or more layers of insulating material (not shown) may be formed and various conductive contact structures (not shown), such as contact structures to contact other areas may be formed in these additional layers of insulating material.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. An integrated circuit product, comprising:
   a first merged doped source/drain region comprising a first P-type region, a first N-type region, and a first conductive layer positioned on the first P-type region and the first N-type region to define a first node of a memory cell;
   a second merged doped source/drain region comprising a second P-type region, a second N-type region, and a second conductive layer positioned on the second P-type region and the second N-type region to define a second node of the memory cell;
   a first pull-down transistor and first and second pass gate transistors having bottom source/drain regions positioned in the first N-type region;
   a first pull-up transistor having a bottom source/drain region positioned in the first P-type region;
   a second pull-down transistor and third and fourth pass gate transistors having bottom source/drain regions positioned in the second N-type region;
   a third pull-down transistor having a bottom source/drain region positioned in the first N-type region;
   a fourth pull-down transistor having a bottom source/drain region positioned in the second N-type region;
   a second pull-up transistor having a bottom source/drain region positioned in the second P-type region;
   a first source/drain contact contacting the first merged doped source/drain region;
   a second source/drain contact contacting the second merged doped source/drain region;
   a first conductive gate structure having an L-shaped horizontal cross section, wherein a first leg of the first conductive gate structure is positioned around a channel region of the first pull-down transistor and a second leg of the first conductive gate structure perpendicular to the first leg is positioned around channel regions of the first pull-up transistor and the third pull-down transistor and contacts the second source/drain contact; and
   a second conductive gate structure having an L-shaped horizontal cross section, wherein a first leg of the second conductive gate structure is positioned around a channel region of the second pull-down transistor and a second leg of the second conductive gate structure perpendicular to the first leg of the second conductive gate structure is positioned around channel regions of the second pull-up transistor and the fourth pull-down transistor and contacts the first source/drain contact.

2. The integrated circuit product of claim 1, wherein each of the first and second merged doped source/drain regions is contiguous.

3. The integrated circuit product of claim 1, wherein each of the first and second merged doped source/drain regions has a substantially rectangular horizontal cross-section.

4. The integrated circuit product of claim 1, wherein the first conductive layer and the second conductive layer comprise a metal silicide.

5. The integrated circuit product of claim 1, further comprising an isolation structure positioned between the first merged doped source/drain region and the second merged doped source/drain region, wherein the first P-type region and the second P-type region are positioned adjacent the isolation structure.

6. The integrated circuit product of claim 1, wherein the first N-type region and the first P-type region engage one another along a first interface and the second N-type region and the second P-type region engage one another along a second interface different than the first interface.

7. The integrated circuit product of claim 1, wherein the first and second pull-up transistors, the first and second pull-down transistors, and the first, second, third and fourth pass gate transistors each comprises a fin structure.

8. The integrated circuit product of claim 1, wherein the first P-type region is positioned at a first end of the first merged doped source/drain region, and the second P-type region is positioned at a second end of the second merged doped source/drain region, wherein the first end is opposite the second end.

9. The integrated circuit product of claim 1, wherein positions of the first pull-up transistor, the first pull-down transistor, and the first and third pass gate transistors in the first merged doped source/drain region are symmetric to positions of the second pull-up transistor, the second pull-down transistor, and the second and fourth pass gate transistors in the second merged doped source/drain region.

10. The integrated circuit product of claim 9, wherein a first position of the first conductive gate structure above the first merged doped source/drain region is symmetric to a second position of the second conductive gate structure above the second merged doped source/drain region, wherein the second position represents a mirror and inversion of the first position.

11. The integrated circuit product of claim 1, wherein positions of the first pull-up transistor, the first pull-down transistor, and the first pass gate transistor in the first merged doped source/drain region are symmetric to positions of the second pull-up transistor, the second pull-down transistor, and the second pass gate transistor in the second merged doped source/drain region.

12. The integrated circuit product of claim 11, wherein positions of the first and second conductive gate structures are symmetric to one another.

13. The integrated circuit product of claim 1, wherein a first read path is formed between the first pass gate transistor and the first node, a second read path is formed between the second pass gate transistor and the first node, a third read path is formed between the third pass gate transistor and the second node, a fourth read path is formed between the fourth pass gate transistor and the second node, and the first, second, third and fourth read paths have a same length.

14. An integrated circuit product, comprising:
a first merged doped source/drain region comprising a first P-type region, a first N-type region, and a first conductive layer positioned on the first P-type region and the first N-type region to define a first node of a memory cell;
a second merged doped source/drain region comprising a second P-type region, a second N-type region, and a second conductive layer positioned on the second P-type region and the second N-type region to define a second node of the memory cell;
first and second pull-down transistors and first and second pass gate transistors having bottom source/drain regions positioned in the first N-type region;
a first pull-up transistor having a bottom source/drain region positioned in the first P-type region;
third and fourth pull-down transistors and third and fourth pass gate transistors having bottom source/drain regions positioned in the second N-type region;
a second pull-up transistor having a bottom source/drain region positioned in the second P-type region;
a first L-shaped gate structure positioned around channel regions of the first pull-up transistor and the first and second pull-down transistors and conductively coupled to the second node; and
a second L-shaped gate structure positioned around channel regions of the second pull-up transistor and the third and fourth pull-down transistors and conductively coupled to the first node.

15. The integrated circuit product of claim 14, further comprising an isolation structure positioned between the first merged doped source/drain region and the second merged doped source/drain region, wherein the first P-type region and the second P-type region are positioned adjacent the isolation structure.

16. The integrated circuit product of claim 14, wherein the first pull-down transistor, the first pass gate transistor, the second pull-up transistor, the fourth pull-down transistor and the third pass gate transistor are arranged in a first row, and the second pull-down transistor, the second pass gate transistor, the first pull-up transistor, the third pull-down transistor and the fourth pass gate transistor are arranged in a second row parallel to the first row.

17. The integrated circuit product of claim 14, wherein a first position of the first L-shaped gate structure above the first merged doped source/drain region is symmetric to a second position of the second L-shaped gate structure above the second merged doped source/drain region, wherein the second position represents a mirror and inversion of the first position.

18. The integrated circuit product of claim 14, wherein a first read path is formed between the first pass gate transistor and the first node, a second read path is formed between the second pass gate transistor and the first node, a third read path is formed between the third pass gate transistor and the second node, a fourth read path is formed between the fourth pass gate transistor and the second node, and the first, second, third and fourth read paths have a same length.

* * * * *